(12) United States Patent
Tseng et al.

(10) Patent No.: US 11,380,823 B2
(45) Date of Patent: Jul. 5, 2022

(54) BACKLIGHT MODULE WITH COMPOSITE COLOR-CONVERSION OPTICAL MATERIAL

(71) Applicant: Unique Materials Co., Ltd., Taipei (TW)

(72) Inventors: Huan-Wei Tseng, Taipei (TW); Chun-Wei Chou, Taipei (TW); Ting-Chia Yang, Taipei (TW); Yi-Lin Yu, Taipei (TW)

(73) Assignee: Unique Materials Co., Ltd., Taipei (TW)

( * ) Notice: Subject to any disclaimer, the term of this patent is extended or adjusted under 35 U.S.C. 154(b) by 132 days.

(21) Appl. No.: 16/659,585

(22) Filed: Oct. 22, 2019

(65) Prior Publication Data

US 2020/0127175 A1    Apr. 23, 2020

Related U.S. Application Data

(60) Provisional application No. 62/869,035, filed on Jul. 1, 2019, provisional application No. 62/748,534, filed on Oct. 22, 2018.

(51) Int. Cl.
*H01L 33/50* (2010.01)
*H01L 33/06* (2010.01)
(Continued)

(52) U.S. Cl.
CPC .......... *H01L 33/504* (2013.01); *H01L 27/156* (2013.01); *H01L 33/06* (2013.01); *H01L 33/58* (2013.01)

(58) Field of Classification Search
CPC ....... H01L 33/504; H01L 33/06; H01L 33/58; H01L 27/156
See application file for complete search history.

(56) References Cited

U.S. PATENT DOCUMENTS

2006/0255711 A1* 11/2006 Dejima ................. G02B 6/004
313/485
2016/0033822 A1*  2/2016 Jiang ................... G02F 1/13338
349/33
(Continued)

FOREIGN PATENT DOCUMENTS

CN        105485573       4/2016
CN        107390427       11/2017
(Continued)

OTHER PUBLICATIONS

"Office Action of Taiwan Counterpart Application", dated Jun. 19, 2020, p. 1-p. 7.
(Continued)

*Primary Examiner* — Christine A Enad
(74) *Attorney, Agent, or Firm* — JCIPRNET

(57) ABSTRACT

Provided is a backlight module including a light source, a light guide plate, and a composite color-conversion layer. The light source emits a blue light. The light guide plate is optically coupled to the light source and the blue light transmits through the light guide plate. The composite color-conversion layer is disposed on the light guide plate. The composite color-conversion layer includes at least three different populations of quantum dots. The at least three different populations of quantum dots at least include a plurality of cyan quantum dots or a plurality of yellow quantum dots.

8 Claims, 14 Drawing Sheets

(51) Int. Cl.
    *H01L 33/58*    (2010.01)
    *H01L 27/15*    (2006.01)

(56) References Cited

U.S. PATENT DOCUMENTS

| | | | |
|---|---|---|---|
| 2016/0370526 A1 | 12/2016 | Kim et al. | |
| 2017/0205666 A1* | 7/2017 | Suh | G02F 1/133504 |
| 2018/0158996 A1* | 6/2018 | Zhang | H01L 33/504 |
| 2018/0237690 A1* | 8/2018 | Chung | C08F 22/1006 |
| 2018/0239246 A1* | 8/2018 | Park | C09K 11/70 |
| 2019/0129206 A1* | 5/2019 | Lee | H01S 5/18302 |

FOREIGN PATENT DOCUMENTS

| | | | |
|---|---|---|---|
| CN | 107556428 | 1/2018 | |
| CN | 107656330 | 2/2018 | |
| JP | 2008112154 | 5/2008 | |
| JP | 2018078252 | 5/2018 | |
| TW | I427371 | 2/2014 | |
| TW | 201642458 | 12/2016 | |
| TW | I638026 | 10/2018 | |
| WO | WO-2015025950 A1 * | 2/2015 | C09K 11/671 |
| WO | 2016158370 | 10/2016 | |

OTHER PUBLICATIONS

"Office Action of Japan Counterpart Application", dated Sep. 15, 2020, p. 1-p. 6.
"Office Action of China Counterpart Application", dated Dec. 31, 2021, p. 1-p. 12.

\* cited by examiner

BACKLIGHT MODULE WITH COMPOSITE COLOR-CONVERSION OPTICAL MATERIAL

CROSS-REFERENCE TO RELATED APPLICATIONS

This application claims the priority benefits of U.S. provisional application Ser. No. 62/748,534 filed on Oct. 22, 2018 and U.S. provisional application Ser. No. 62/869,035 filed on Jul. 1, 2019. The entirety of each of the above-mentioned patent applications is hereby incorporated by reference herein and made a part of this specification.

BACKGROUND OF THE INVENTION

Field of the Invention

The invention relates to a backlight module with a composite color-conversion optical material.

Description of Related Art

Quantum dots are very small semiconductor nanostructures that are invisible to the naked eye. When quantum dots are stimulated by light, the quantum dots emit colored light, which is determined by composition, size and shape of the quantum dots. This characteristic enables the quantum dots to change the color of light emitted by a light source. In recent years, quantum dot-containing polymer composite materials have been widely used in fields of backlight module and display device, etc.

However, the display having only a single luminescent material have the problem of a narrow color gamut. Adding to two luminescent materials can increase the color gamut of the display, but it cannot exhibit some specific colors, such as cyan. In addition, the use of 450 nm blue light as a light source easily causes eye strains and is harmful to human eyes. Although there are a variety of techniques for reducing blue light, such as anti-blue light films or programs that reduce the total blue light intensity of the screen. These techniques simply reduce the intensity of the blue light, but cause the display to appear yellowish in color, narrow the color gamut, and distort the color of the display.

SUMMARY OF THE INVENTION

The invention provides a backlight module with a plurality of different populations of quantum dots which can realize an ultra-wide color gamut using multi-primary color that allows the faithful reproduction of colors.

The invention provides another backlight module with a plurality of different populations of quantum dots which can reduce the blue light harmful to the eyes while maintaining a wide color gamut and faithful reproduction of colors.

The invention provides a backlight module including a light source, a light guide plate, and a composite color-conversion layer. The light source emits a blue light. The light guide plate is optically coupled to the light source and the blue light transmits through the light guide plate. The composite color-conversion layer is disposed on the light guide plate. The composite color-conversion layer includes at least three different populations of quantum dots. The at least three different populations of quantum dots at least include a plurality of cyan quantum dots or a plurality of yellow quantum dots.

In one embodiment of the invention, the at least three different populations of quantum dots include a plurality of red quantum dots, a plurality of green quantum dots, and the plurality of cyan quantum dots mixed uniformly.

In one embodiment of the invention, the at least three different populations of quantum dots include a plurality of red quantum dots, a plurality of green quantum dots, and the plurality of yellow quantum dots mixed uniformly.

In one embodiment of the invention, the at least three different populations of quantum dots include a plurality of red quantum dots, a plurality of green quantum dots, the plurality of cyan quantum dots, and the plurality of yellow quantum dots mixed uniformly.

In one embodiment of the invention, the composite color-conversion layer includes a first layer, a second layer, and a third layer. The first layer is adjacent to the light source and includes a plurality of first quantum dots. The second layer is further away from the light source than the first layer and includes a plurality of second quantum dots. The third layer is disposed between the first layer and the second layer and includes a plurality of third quantum dots. An emission wavelength of the plurality of first quantum dots is longer than an emission wavelength of the plurality of third quantum dots and the emission wavelength of the plurality of third quantum dots is longer than an emission wavelength of the plurality of second quantum dots.

In one embodiment of the invention, the third layer is in direct contact with the first layer and the second layer, and the first layer, the second layer, and the third layer are sandwiched between two substrates.

In one embodiment of the invention, the backlight module further including at least one substrate disposed between the first layer and the third layer or between the second layer and the third layer.

In one embodiment of the invention, the at least one substrate is free of a barrier layer.

In one embodiment of the invention, the backlight module further including two first substrates, two second substrates, and two third substrates. The first layer is sandwiched between the two first substrates. The second layer is sandwiched between the two second substrates. The third layer is sandwiched between the two third substrates. One of the two first substrate is in direct contact with one adjacent third substrate and one of the two second substrate is in direct contact with adjacent other third substrate.

In one embodiment of the invention, the plurality of first quantum dots include a plurality of red quantum dots, the plurality of second quantum dots include a plurality of green quantum dots, and the plurality of third quantum dots include the plurality of yellow quantum dots.

In one embodiment of the invention, the plurality of first quantum dots include a plurality of red quantum dots, the plurality of second quantum dots include the plurality of cyan quantum dots, and the plurality of third quantum dots include a plurality of green quantum dots.

In one embodiment of the invention, the composite color-conversion layer further includes a fourth layer disposed between the first layer and the third layer and includes a plurality of fourth quantum dots, wherein the plurality of fourth quantum dots include the plurality of yellow quantum dots.

In one embodiment of the invention, each of the first, second, third, and fourth layers includes a resin material, the plurality of first, second, third, and fourth quantum dots are respectively dispersed and embedded in the resin material, wherein the resin material is prepared by a precursor, the precursor includes a surfactant having a thiol group.

In one embodiment of the invention, the surfactant is a compound represented by formula (I), formula (II) or formula (III) below:

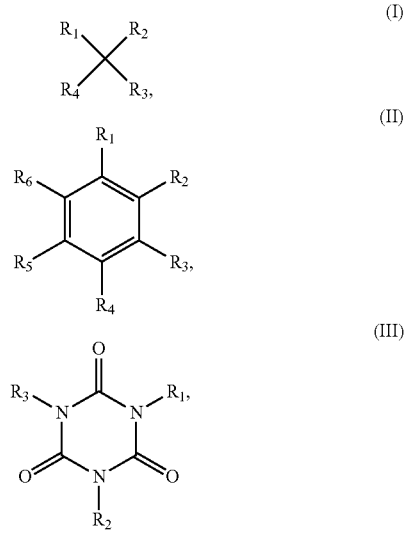

wherein $R_1$, $R_2$, $R_3$, $R_4$, $R_5$ and $R_6$ are the same as or different from one another, and are independently selected from the group consisting of hydrogen, $C_1$ to $C_{20}$ alkyl, $C_2$ to $C_{20}$ alkenyl, $C_2$ to $C_{20}$ alkynyl, $C_1$ to $C_{20}$ hydroxy alkyl, $C_1$ to $C_{20}$ alkyl ester, $C_2$ to $C_{20}$ alkyl ketone, $C_1$ to $C_{20}$ alkyl thioether and $C_1$ to $C_{20}$ alkoxy, wherein at least two of $R_1$ to $R_4$ have a thiol group when the surfactant is the compound of formula (I); at least two of $R_1$ to $R_6$ have a thiol group when the surfactant is the compound of formula (II); and at least two of $R_1$ to $R_3$ have a thiol group when the surfactant is the compound of formula (III).

In one embodiment of the invention, the precursor of the resin material includes: 5 wt % to 30 wt % of the surfactant having at least two thiol groups, 30 wt % to 50 wt % of a first acrylate monomer, 15 wt % to 30 wt % of a second acrylate monomer, 5 wt % to 20 wt % of a cross-linker, and 1 wt % to 2 wt % of an initiator.

The invention provides a backlight module including a light source, a red phosphor layer, a light guide plate, and a composite color-conversion layer. The light source emits a blue light. The red phosphor layer is disposed on the light source. The light guide plate is optically coupled to the light source, and the blue light transmits through the red phosphor layer and the light guide plate. The composite color-conversion layer is disposed over the light guide plate. The composite color-conversion layer includes at least two different populations of quantum dots, and the at least two different populations of quantum dots at least includes a plurality of cyan quantum dots or a plurality of yellow quantum dots.

In one embodiment of the invention, the at least two different populations of quantum dots include a plurality of green quantum dots, the plurality of cyan quantum dots, and the plurality of yellow quantum dots mixed uniformly.

In one embodiment of the invention, the composite color-conversion layer includes a first layer and a second layer. The first layer is adjacent to the light source and includes the plurality of yellow quantum dots. The second layer is further away from the light source than the first layer and includes a plurality of green quantum dots.

In one embodiment of the invention, the composite color-conversion layer includes a first layer and a second layer. The first layer is adjacent to the light source and includes a plurality of green quantum dots. The second layer is further away from the light source than the first layer and includes a plurality of cyan quantum dots.

In one embodiment of the invention, the composite color-conversion layer includes a first layer, a second layer, and a third layer. The first layer is adjacent to the light source and includes the plurality of yellow quantum dots. The second layer is further away from the light source than the first layer and includes a plurality of cyan quantum dots. The third layer is disposed between the first layer and the second layer and includes a plurality of green quantum dots.

Based on the above, in the embodiment of the present invention, a backlight module having a plurality of different populations of quantum dots with different emission wavelengths to realize an ultra-wide color gamut using multi-primary color, thereby increasing the ability to faithfully reproduce colors. In addition, in the embodiment of the present invention, the blue light harmful to eyes is replaced by the cyan light emitted by the cyan quantum dots, which can provide eye protection. Further, in the embodiment of the present invention, a plurality of quantum dots having different emission wavelengths are respectively disposed at different levels, so as to prevent the quantum dots with the longer emission wavelength from absorbing the light emitted by the quantum dots with the shorter emission wavelength, thereby preventing second conversion from reducing the light conversion efficiency. In other words, the backlight module of the embodiment of the present invention can increase the light conversion efficiency, thereby improving the energy efficiency and display brightness of the display device.

In order to make the aforementioned and other features and advantages of the invention more comprehensible, several embodiments accompanied with figures are described in detail below.

DETAILED DESCRIPTION OF DISCLOSED EMBODIMENTS

Figure 1:
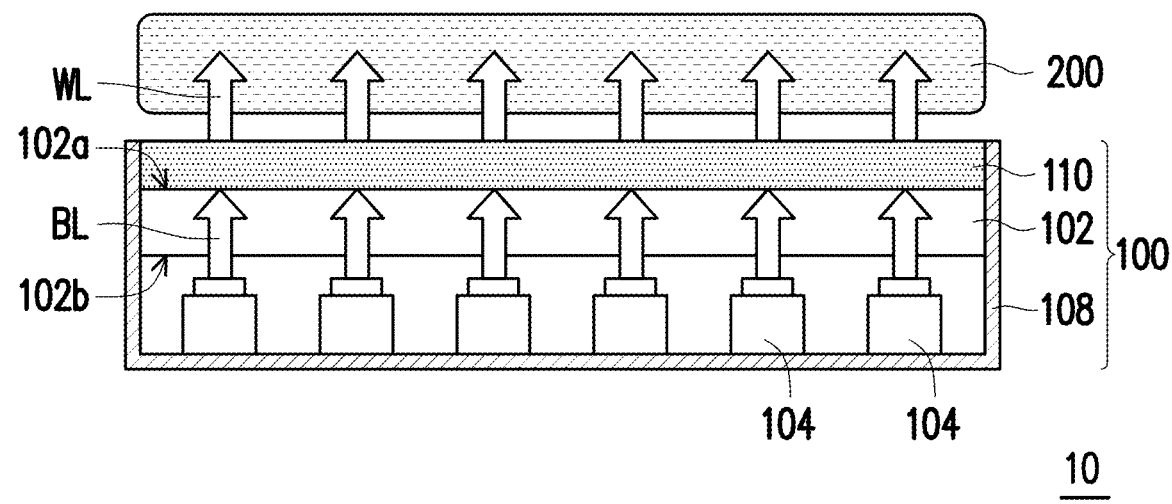
FIG. 1 is a schematic cross-sectional view of a display device according to an embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numerals represent the same or similar components, and are not repeated in the following paragraphs.

FIG. 1 is a schematic cross-sectional view of a display device according to an embodiment of the invention. FIG. 2A to FIG. 2G are respectively enlarged schematic views of various kinds of composite color-conversion layers of FIG. 1.

Referring to FIG. 1, in an embodiment of the present invention, a display device 10 includes a backlight module 100 and a display panel 200. The backlight module 100 is disposed at one side of the display panel 200 (e.g., a lower side of the display panel 200). In some embodiments, the display panel 200 may be, but is not limited to, a liquid crystal display panel. The composition and arrangement of the liquid crystal display panel described above are well known to those of ordinary skill in the optical arts and will not be described in detail herein.

In some embodiments, the backlight module 100 includes a light guide plate 102, a plurality of light sources 104, a composite color-conversion layer 110, and a reflective layer 108. The light guide plate 102 has a light-emitting surface 102a and a light-incident surface 102b disposed opposite to each other. In the present embodiment, as shown in FIG. 1, the light guide plate 102 has a rectangular shape in cross-section. In alternative embodiments, the light guide plate 102 may also have a rectangular shape, a trapezoidal shape or other suitable shape in cross-section. In an embodiment, the medium of the light guide plate 102 may include transparent plastic, glass or a material capable of guiding light. In alternative embodiments, the light guide plate 102 may be poly(methyl methacrylate) (PMMA), polycarbonate (PC), polyethylene terephthalate (PET), polyimide (PI) or other suitable material. In other embodiments, the light guide plate 102 has a haze gradually increasing along a direction from the light-incident surface 102b to the light-emitting surface 102a or has a uniform haze. Herein, the "haze" refers to a percentage of light that deviates from the incident beam by greater than 2.5 degrees when passing through a transparent medium, and can be used for the evaluation of a light scattering state of a transparent medium. That is, the higher the haze of the transparent medium, the lower the gloss and the transparency (or distinctness of image) thereof. In contrast, the lower the haze of the transparent medium, the higher the gloss and the transparency (or distinctness of image) thereof.

As shown in FIG. 1, the light sources 104 may emit blue light BL. In the present embodiment, the light sources 104 are disposed at the light-incident surface 102b of the light guide plate 102 to form a direct-lit structure. In another embodiment, the light source 104 is also disposed at a side surface of the light guide plate 102 to form an edge-lit structure. In an embodiment, the light sources 104 may be a light emitting diode (LED), or other suitable light emitting element. The blue light BL emitted by the light sources is optically coupled to the light guide plate 102 and transmits through the light guide plate 102 to arrive at the composite color-conversion layer 110. The blue light BL emitted from the light sources 104 is then partially converted into a red light, a green light, and a cyan light by the composite color-conversion layer 110, so that the blue light BL, the red light, the green light, and the cyan light are mixed together to form a white light WL which then transmits to the display panel 200 on the composite color-conversion layer 110.

The reflective layer 108 is disposed on the back surface 102b of the light guide plate 102 to reflect the light BL emitted from the light sources 104 into the composite color-conversion layer 110, thereby improving the luminous efficiency of the composite color-conversion layer 110. In one embodiment, a material of the reflective layer 108 includes a reflective metallic material, and examples thereof include gold, silver, aluminum, copper or other suitable metallic material.

Figure 2A:
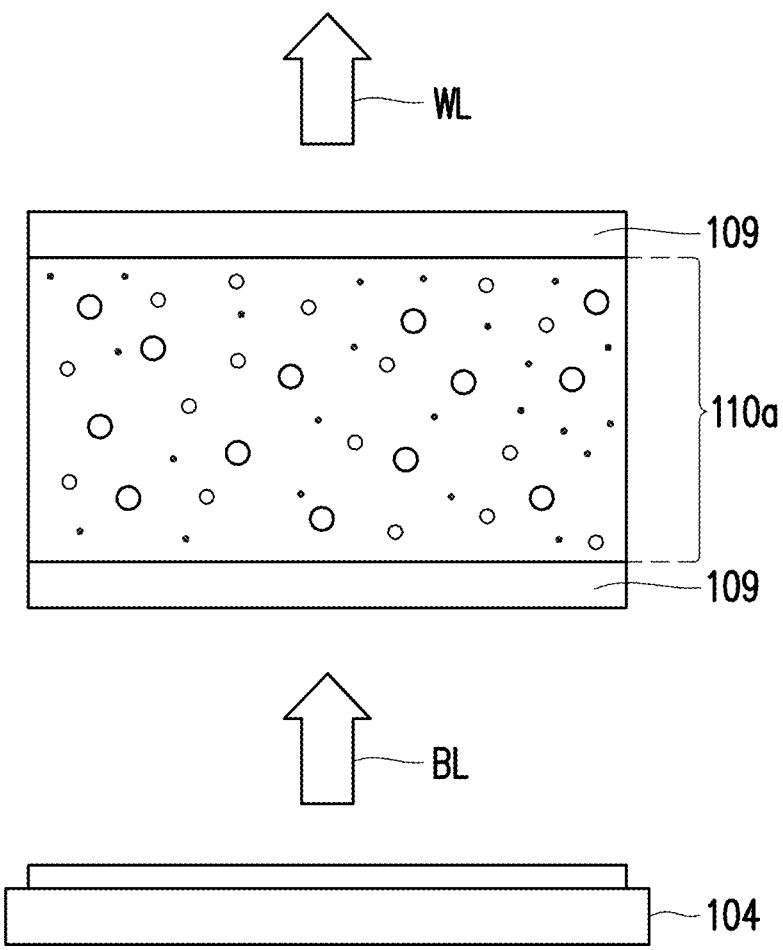
FIG. 2A to FIG. 2G are respectively enlarged schematic views of various kinds of composite color-conversion layers of FIG. 1.

The composite color-conversion layer 110 is disposed on the light-emitting surface 102a of the light guide plate 102. In an embodiment, as shown in FIG. 2A, a composite color-conversion layer 110a includes at least three kinks of quantum dots dispersed and embedded in a resin material. In one embodiment, the composite color-conversion layer 110a includes a plurality of red quantum dots, a plurality of green quantum dots, and a plurality of cyan quantum dots mixed uniformly in the resin material. In another embodiment, the composite color-conversion layer 110a includes a plurality of red quantum dots, a plurality of green quantum dots, and a plurality of yellow quantum dots mixed uniformly in the resin material. In an alternative embodiment, the composite color-conversion layer 110a may also include a plurality of red quantum dots, a plurality of green quantum dots, a plurality of cyan quantum dots, and a plurality of yellow quantum dots mixed uniformly in the resin material. As shown in FIG. 2A, the composite color-conversion layer 110a may be sandwiched between two substrates 109. In some embodiments, the substrate 109 may include polyethylene terephthalate (PET), epoxy, silicone, acryl, or the like. In another embodiment, the substrate 109 may be an optical film having other optical properties, such as a brightness enhancement film, a polarizing film, a scattering film, and a light diffuser film. In alternative embodiments, the substrate 109 may include a barrier layer (e.g., a diamond-like carbon thin film, a silicon oxide layer, a titanium oxide layer, an aluminum oxide layer, a silicon nitride layer, or the like) therein, so as to effectively block the external environmental factors such as moisture, oxygen, volatile substances and so on. In other embodiments, the substrate 109 may also not include a barrier layer therein.

It should be noted that, in an embodiment, a combination of the blue light sources 104 and the plurality of red quantum dots, the plurality of green quantum dots, and the plurality of yellow quantum dots may constitute a four-primary color backlight module to achieve an ultra-wide color gamut using multi-primary color, thereby increasing the ability of the display faithfully reproduce colors. In another embodiment, the blue light source 104 and the plurality of red quantum dots, the plurality of green quantum dots, and the plurality of cyan quantum dots may constitute another four-primary color backlight module, in which the cyan quantum dots may emit cyan light of approximately 490 nm, thereby replacing a portion of the blue light (which has an emission wavelength of approximately 450 nm) which is more harmful to eyes. That is to say, the four-primary color backlight module with the cyan quantum dots can reduce the intensity of harmful blue light and thus provide better eye protection without sacrificing the wide color gamut. In alternative embodiments, the blue light source 104 and the plurality of red quantum dots, the plurality of green quantum dots, the plurality of cyan quantum dots, and the plurality of yellow quantum dots may constitute a five-primary color backlight module. In the case, the five-primary color backlight module not only has a wider color gamut, but can also achieve eye protection. In other embodiments, the blue light source 104 and the red light emitted by the plurality of red quantum dots may also be mixed to form a magenta color. Therefore, the blue light source 104 and the plurality of red quantum dots, the plurality of green quantum dots, the plurality of cyan quantum dots, and the plurality of yellow quantum dots may also form a six-primary color backlight module to achieve ultra-wide color gamut and eye protection.

Figure 2B:
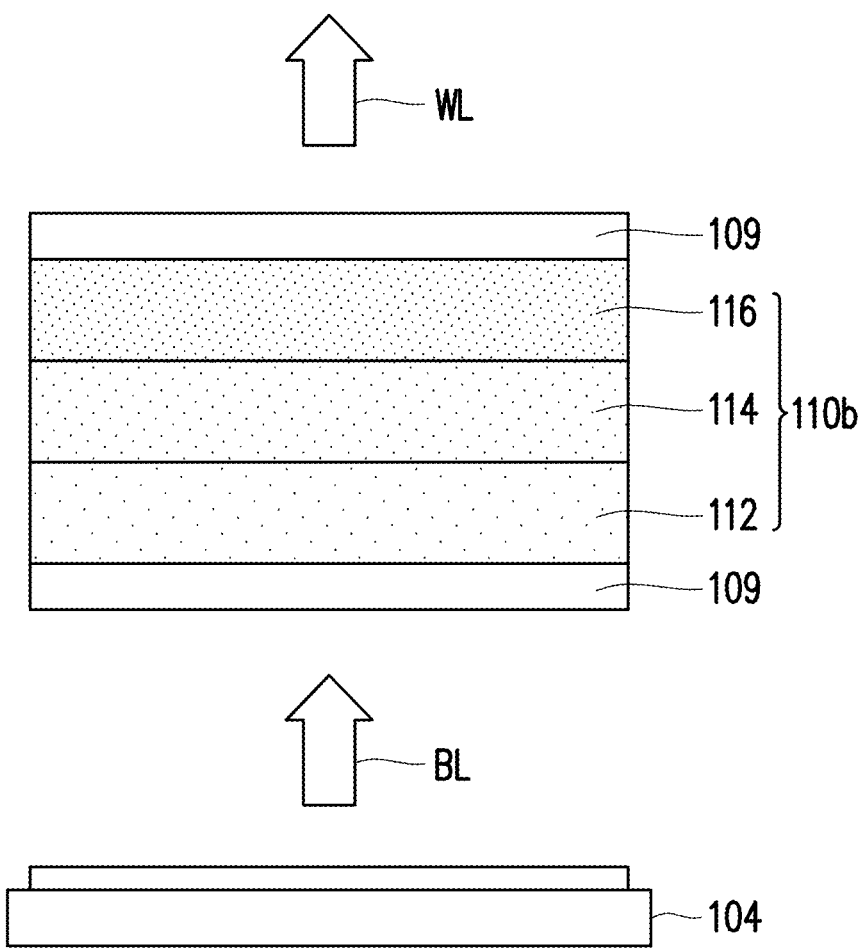

Although the composite color-conversion layer 110a illustrated in FIG. 2A is a mixed quantum dot layer mixed with at least three different populations of quantum dots, the invention is not limited thereto. In another embodiment, as shown in FIG. 2B, a composite color-conversion layer 110b includes a first layer 112, a second layer 116, and a third layer 114. The first layer 112 is adjacent to the light source 104 and includes a plurality of first quantum dots. The second layer 116 is further away from the light source 104 than the first layer 112 and includes a plurality of second quantum dots. The third layer 114 is disposed between the first layer 112 and the second layer 116 and includes a plurality of third quantum dots. As shown in FIG. 2B, the composite color-conversion layer 110b may also be sandwiched between the two substrates 109.

It should be noted that an emission wavelength of the plurality of first quantum dots is longer than an emission wavelength of the plurality of third quantum dots and the emission wavelength of the plurality of third quantum dots is longer than an emission wavelength of the plurality of second quantum dots. That is, the emission wavelengths of the quantum dots are gradually decreased along a direction from close to the light source 104 to away from the light source 104. In the case, it is possible to prevent the quantum dots having a longer emission wavelength from absorbing light with a shorter wavelengths emitted by other quantum dots and resulting in a second light conversion, thereby increasing the light conversion efficiency of the composite color-conversion layer 110b. For example, the first quantum dots may be red quantum dots, the second quantum dots may be green quantum dots, and the third quantum dots may be yellow quantum dots. Generally, in addition to absorbing blue light, the red quantum dots also absorb the yellow or green light emitted by the yellow or green quantum dots and convert them into red light. In the case, the red quantum dots would have a lower light conversion efficiency due to undergoing two conversions (i.e., blue light→yellow or green light→red light). On the other hand, the composite color-conversion layer has a lower yellow or green light intensity due to the yellow or green light emitted by the yellow or green quantum dots being absorbed by the red quantum dots. In the embodiment, the red quantum dots, the green quantum dots, the yellow quantum dots are respectively disposed in layers at different levels. The red quantum dots are disposed in the first layer 112 (hereinafter referred to as the red quantum dot layer 112) close to the light source 104, the green quantum dots are disposed in the second layer 116 (hereinafter referred to as the green quantum dot layer 116) far from the light source 104, and the yellow quantum dots are disposed in the third layer 114 (hereinafter referred to as the yellow quantum dot layer 114) between the red quantum dot layer 112 and the green quantum dot layer 116. In the case, the blue light BL first passes through the red quantum dot layer 112 and converts a portion of the blue light BL into a red light. Subsequently, another portion of the blue light BL and the red light pass through the yellow quantum dot layer 114 and the green quantum dot layer 116 in order, so as to convert another portion of the blue light BL into a yellow light and a green light. Since the yellow and green lights do not pass through the red quantum dot layer 112, it can prevent the red quantum dots from absorbing the yellow and green lights and performing a second light conversion, which can decrease the light conversion efficiency. Similarly, since the green light would not pass through the yellow quantum dot layer, it can prevent the decrease of the light conversion efficiency due to a second light conversion. That is to say, in the embodiment, the red quantum dot layer 112, the yellow quantum dot layer 114, and the green quantum dot layer 116 are respectively disposed at different levels, which can avoid the decrease in the light conversion efficiency due to a second light conversion by the quantum dots. As such, the present embodiment can increase the light conversion efficiency of the red quantum dot layer 112, the yellow quantum dot layer 114, and the green quantum dot layer 116, thereby enhancing the energy efficiency and display brightness of the display device including the composite color-conversion layer 110b.

In addition, in the embodiment, the red quantum dot layer 112, the yellow quantum dot layer 114, and the green quantum dot layer 116 are respectively disposed at different levels, which can avoid quantum dots absorbing light emitted by other quantum dots with shorter emission wavelengths, thereby affecting the light emission intensity. Therefore, the present embodiment can adjust the concentration of any one population of the quantum dots without affecting the emission intensities of the quantum dots having other colors at the same time. That is to say, in the present embodiment, the configuration of the composite color-conversion layer can simplify the adjustment of the white point to accurately exhibit the desired color coordinate and optical characteristics. Moreover, as shown in FIG. 2B, the combination of the blue light sources 104 and the red quantum dot layer 112, the yellow quantum dot layer 114, and the green quantum dot layer 116 may constitute a four-primary color backlight module to achieve an ultra-wide color gamut using multi-primary color, thereby increasing the ability of the display to faithfully reproduce colors.

Figure 2C:
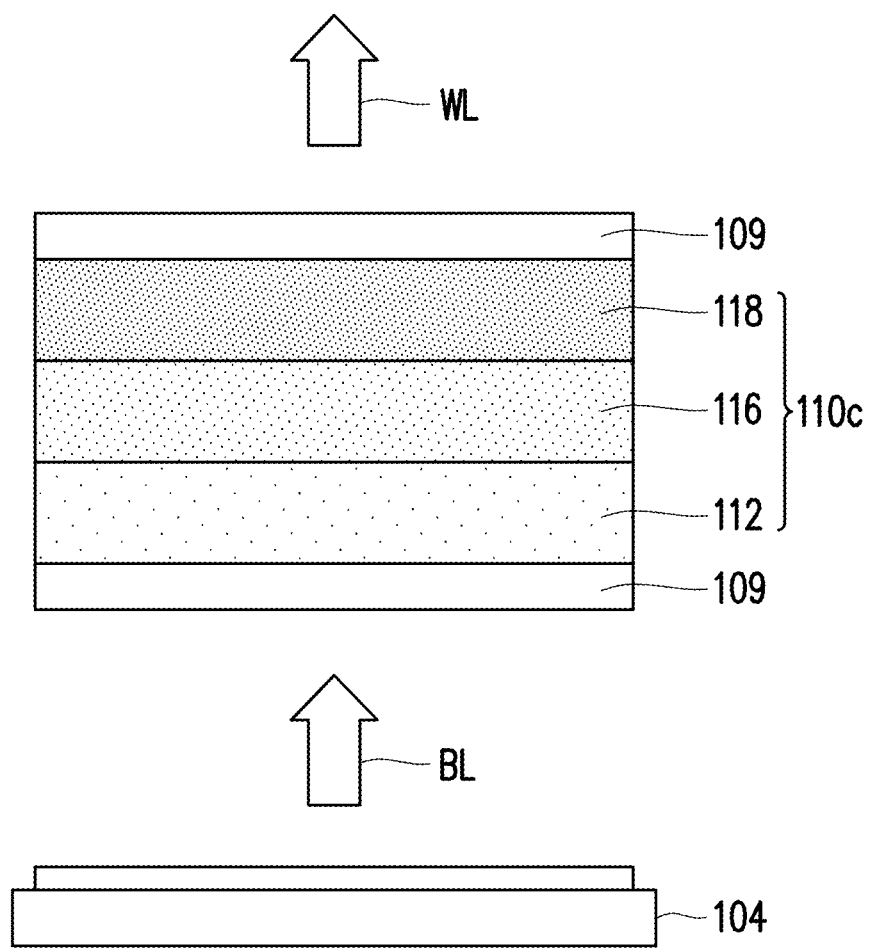

Referring to FIG. 2C, in alternative embodiments, the composite color-conversion layer 110c includes a red quantum dot layer 112, a green quantum dot layer 116, and a cyan quantum dot layer 118. The red quantum dot layer 112 is adjacent to the light source 104. The cyan quantum dot layer 118 is further away from the light source 104 than the red quantum dot layer 112. The green quantum dot layer 116 is disposed between the red quantum dot layer 112 and the cyan quantum dot layer 118. As shown in FIG. 2C, the composite color-conversion layer 110c may also be sandwiched between the two substrates 109. In the embodiment, the red quantum dot layer 112, the green quantum dot layer 116, and the cyan quantum dot layer 118 are also respectively disposed at different levels, which can increase the light conversion efficiency of the red quantum dot layer 112, the green quantum dot layer 116, and the cyan quantum dot layer 118, while also simplifying the adjustment of the white point. Moreover, the blue light source 104 and the red quantum dot layer 112, the green quantum dot layer 116, and the cyan quantum dot layer 118 may constitute another four-primary color backlight module to reduce the intensity of the harmful blue light, thereby providing better eye protection.

Figure 2D:
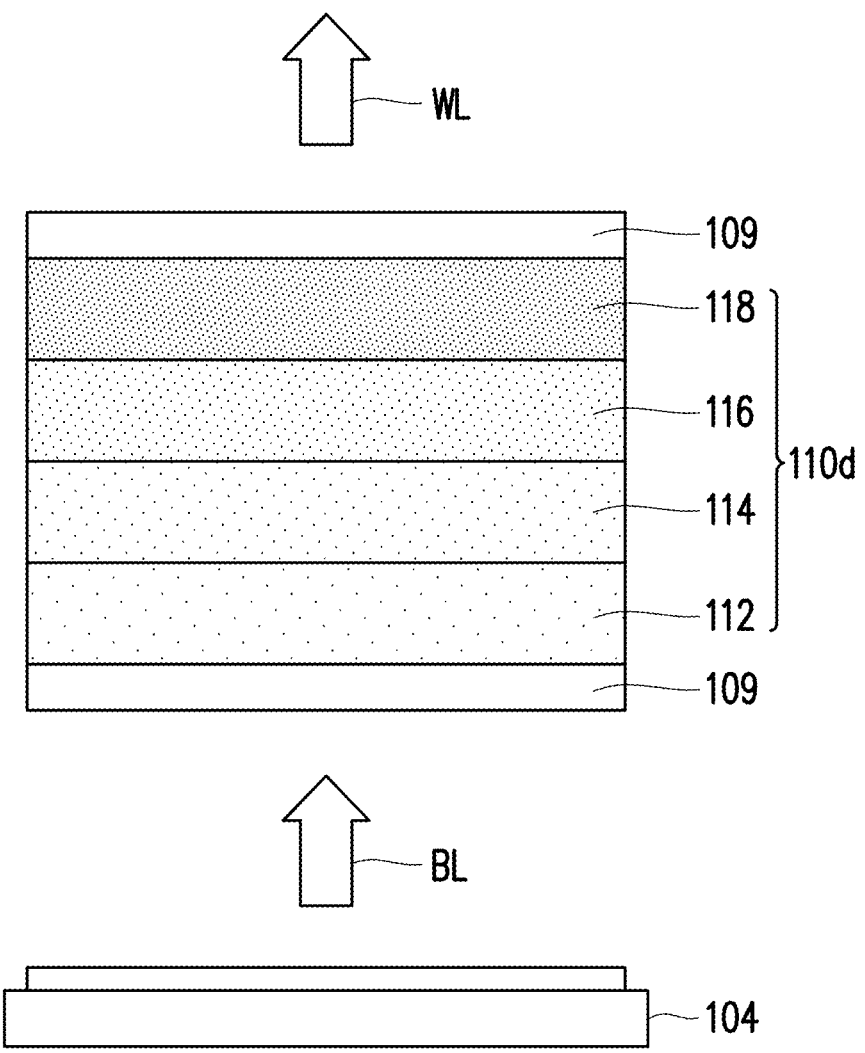

Referring to FIG. 2D, the configuration of the composite color-conversion layer 110d is the same as that of the composite color-conversion layer 110c and has been described in detail in the above paragraphs, and thus will not be described again. A difference between the above two lies in that the composite color-conversion layer 110d further includes a yellow quantum dot layer 114 (also referred to as a fourth layer) disposed between the red quantum dot layer 112 and the green quantum dot layer 116. In the embodiment, the red quantum dot layer 112, the yellow quantum dot layer 114, the green quantum dot layer 116, and the cyan quantum dot layer 118 are respectively disposed at different levels, which not only can increase the light conversion efficiency of the red quantum dot layer 112, the yellow quantum dot layer 114, the green quantum dot layer 116, and the cyan quantum dot layer 118, but also simplify the adjustment of the white point. Moreover, the blue light source 104 and the red quantum dot layer 112, the yellow quantum dot layer 114, the green quantum dot layer 116, and the cyan quantum dot layer 118 may constitute a five-primary color backlight module. In this case, the five-primary color backlight module not only has a wider color gamut, but also provide better eye protection. In other embodiments, the blue light source 104 and the red quantum dot layer 112 may also produce a magenta light formed by mixing the blue and red lights. Therefore, the blue light source 104 and the red quantum dot layer 112, the yellow quantum dot layer 114, the green quantum dot layer 116, and the cyan quantum dot layer 118 can also form a six-primary color backlight module to achieve ultra-wide color gamut and with better eye protection.

Figure 2E:
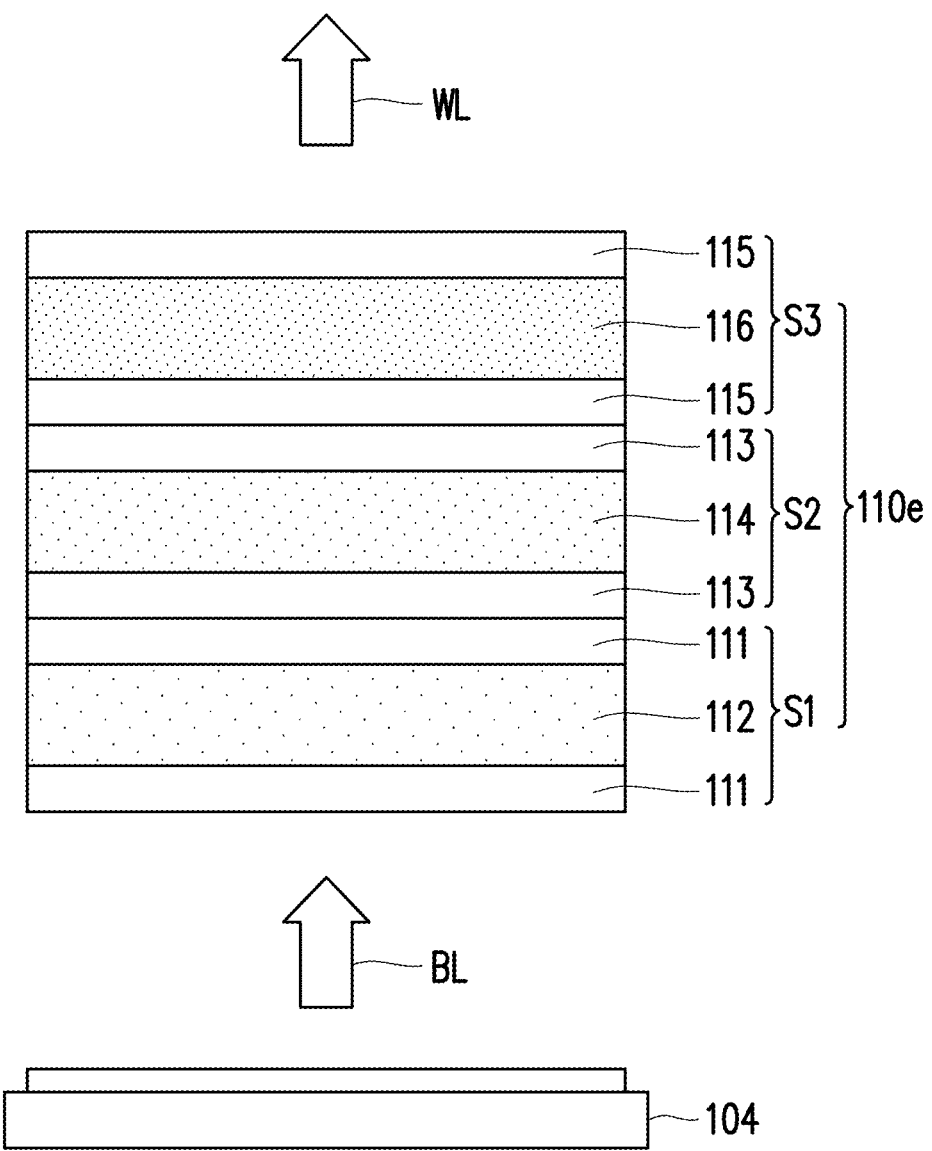

In one embodiment, as shown in FIG. 2B, although the yellow quantum dot layer 114 is in direct contact with the red quantum dot layer 112 and the green quantum dot layer 116, the invention is not limited thereto. In other embodiments, the yellow quantum dot layer 114 may also not directly contact the red quantum dot layer 112 and the green quantum dot layer 116. Referring to FIG. 2E, substrates 111 and 113 may be disposed between the red quantum dot layer 112 and the yellow quantum dot layer 114 to separate the red quantum dot layer 112 from the yellow quantum dot layer 114. Substrates 113, 115 may be disposed between the yellow quantum dot layer 114 and the green quantum dot layer 116 to separate the yellow quantum dot layer 114 from the green quantum dot layer 116. Specifically, the red quantum dot layer 112 may be sandwiched between the two first substrates 111 to form a first stack S1, the yellow quantum dot layer 114 may be sandwiched between the two second substrates 113 to form the second stack S2, and the green quantum dot layer 116 may be sandwiched between the two third substrates 115 to form a third stack S3. Next, the first stack S1, the second stack S2, and the third stack S3 are sequentially stacked to form a composite color-conversion layer 110e. In another embodiment, a single-layer substrate, a two-layer substrate, or a multi-layer substrate may be disposed between the yellow quantum dot layer 114, the red quantum dot layer 112, and the green quantum dot layer 116 respectively, so as to separate different quantum dot layers. The material of the substrates 111, 113, 115 are similar to those of the substrates 109 and has been described in detail in the above paragraphs, and thus will not be described again.

Figure 2F:
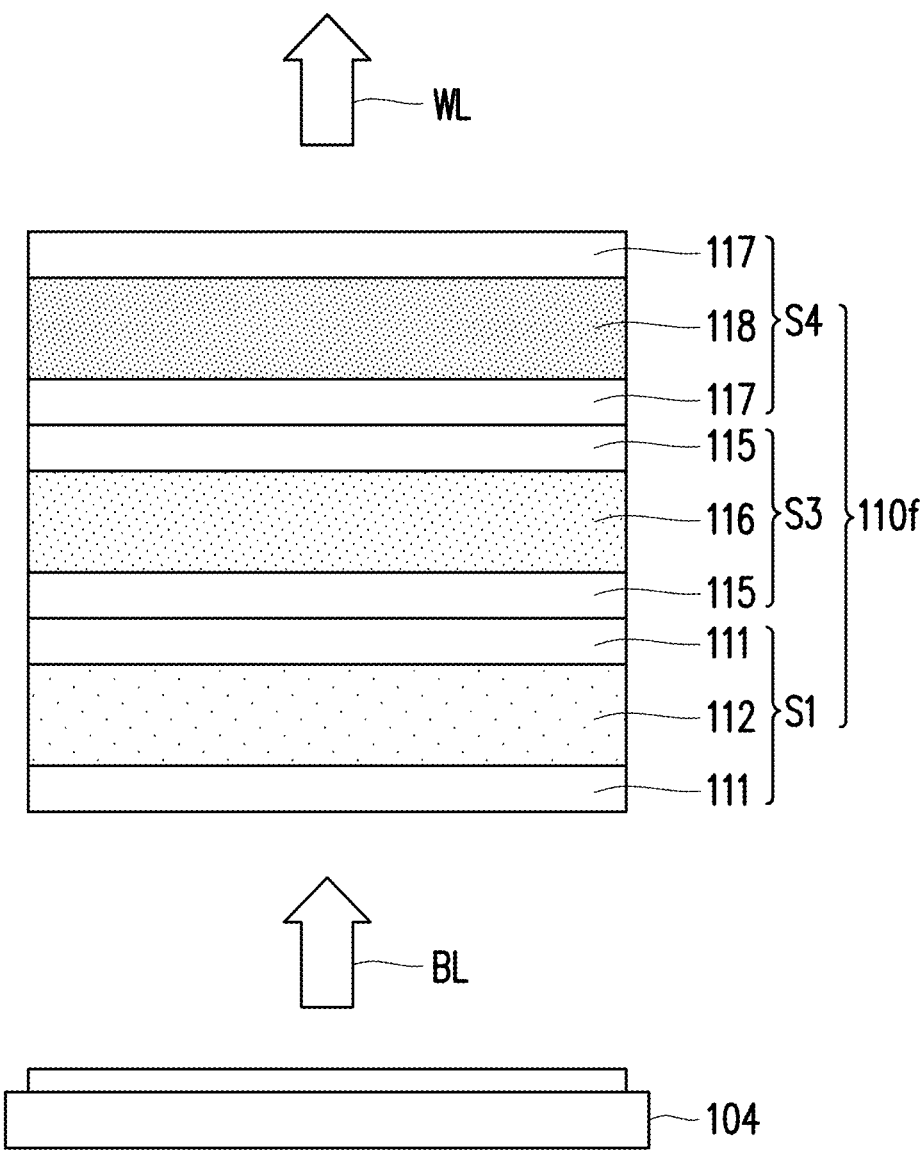

In one embodiment, as shown in FIG. 2C, although the green quantum dot layer 116 is in direct contact with the red quantum dot layer 112 and the cyan quantum dot layer 118, the invention is not limited thereto. In other embodiments, the green quantum dot layer 116 may also not directly contact the red quantum dot layer 112 and the cyan quantum dot layer 118. Referring to FIG. 2F, the red quantum dot layer 112 may be sandwiched between two first substrates 111 to form a first stack S1, the green quantum dot layer 116 may be sandwiched between two third substrates 115 to form a third stack S3, and the cyan quantum dot layer 118 may be sandwiched between two fourth substrates 117 to form a fourth stack S4. Next, the first stack S1, the third stack S3, and the fourth stack S4 are sequentially stacked to form a composite color-conversion layer 110f. In another embodiment, a single-layer substrate, a two-layer substrate, or a multi-layer substrate may be disposed between the green quantum dot layer 116, the red quantum dot layer 112, and the cyan quantum dot layer 118 respectively, so as to separate different quantum dot layers.

Figure 2G:
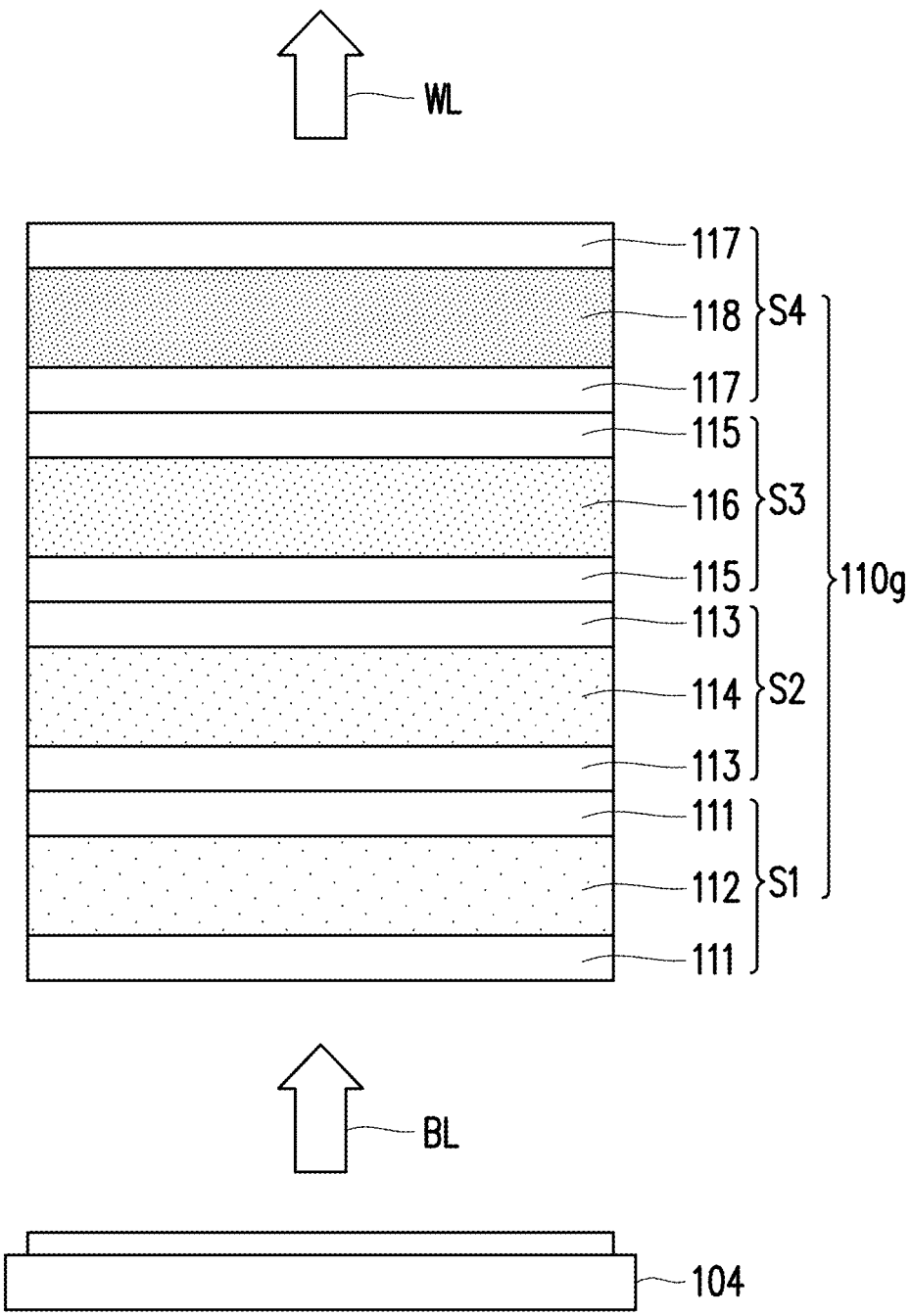

In one embodiment, as shown in FIG. 2D, although the red quantum dot layer 112, the yellow quantum dot layer 114, the green quantum dot layer 116, and the cyan quantum dot layer 118 are directly in contact with each other, the present invention is not limited thereto. In other embodiments, as shown in FIG. 2G, the red quantum dot layer 112 may be sandwiched between two first substrates 111 to form a first stack S1, the yellow quantum dot layer 114 may be sandwiched between two second substrates 113 to form a second stack S2, the green quantum dot layer 116 may be sandwiched between two third substrates 115 to form a third stack S3, and the cyan quantum dot layer 118 may be sandwiched between two fourth substrates 117 to formed a fourth stack S4. Next, the first stack S1, the second stack S2, the third stack S3, and the fourth stack S4 are sequentially stacked to form a composite color-conversion layer 110g. In another embodiment, a single-layer substrate, a two-layer substrate, or a multi-layer substrate may be disposed between the red quantum dot layer 112, the yellow quantum dot layer 114, the green quantum dot layer 116, and the cyan quantum dot layer 118 respectively, so as to separate different quantum dot layers.

Figure 3:
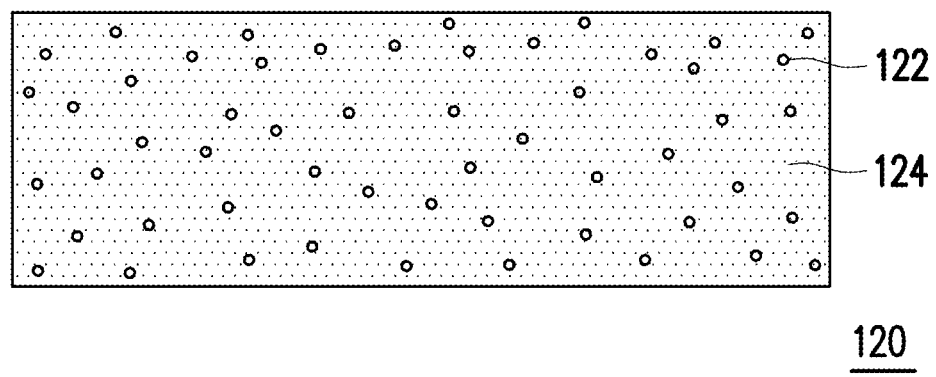
FIG. 3 is an enlarged schematic view of a quantum dot layer according to an embodiment of the invention.

FIG. 3 is an enlarged schematic view of a quantum dot layer according to an embodiment of the invention. In the following embodiments, a quantum dot layer 120 of FIG. 3 may be, but is not limited to, any one layer of the quantum dot layers 112, 114, 116, 118 illustrated in FIGS. 2A-2G. In addition, although FIG. 2A to FIG. 2G and FIG. 3 illustrate that the quantum dot layers are all film-like, the invention is not limited thereto. In other embodiments, the said quantum dot layers may be formed into different shapes or different structures according to actual needs, such as a dot structure, a linear structure, a film structure, a cubic structure, a cylindrical structure, a triangular column structure, and a hemispherical structure, or a combination thereof.

Specifically, as shown in FIG. 3, the quantum dot layer 120 includes a luminescent material 122 dispersed and embedded in a resin material 124. In one embodiment, the content of the luminescent material 122 is 0.01 wt % to 15 wt %. In the present embodiment, the luminescent material 122 includes a plurality of quantum dots. The quantum dots include a core, a core-shell, a core-alloy layer-shell, or a combination thereof. Particle size or dimension of the quantum dots may be adjusted according to needs (e.g., to emit visible lights of different colors), and the invention is not limited thereto.

In one embodiment, said "core" may be, for example, at least one selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe and alloys thereof. In one embodiment, said "shell" is, for example, at least one selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe and alloys thereof. Said core or said shell may be selected according to different needs, and the invention is not limited thereto.

In one embodiment, the content of the resin material 124 is 85 wt % to 99.99 wt %. In some embodiments, the resin material 124 may be acrylic resin, epoxy, silicone, or a combination thereof. Specifically, the resin material 124 is an acrylate polymer which is prepared from a precursor. The precursor includes: 30 wt % to 50 wt % of a first acrylate monomer, 15 wt % to 30 wt % of a second acrylate monomer, 5 wt % to 30 wt % of a surfactant having a thiol group, 5 wt % to 20 wt % of a cross-linker, and 1 wt % to 2 wt % of an initiator. In alternative embodiments, the content of the surfactant is less than the content of the first acrylate monomer. In some embodiments, the quantum dot layers 112, 114, 116, and 118 may include the precursors made of the same material or different materials. In other embodiments, the quantum dot layers 112, 114, 116, and 118 may include the luminescent material 122 and the resin material 124 with the same content or different contents.

In one embodiment, the first acrylate monomer may have a molecular weight ranging from 100 to 1,000. The first acrylate monomer may be selected from the group consisting of methyl methacrylate, ethyl methacrylate, isopropyl methacrylate, n-butyl methacrylate, isobutylmethacrylate, tert-butyl methacrylate, n-amyl methacrylate, isoamyl methacrylate, n-hexyl methacrylate, tridecyl methacrylate, stearyl methacrylate, decyl methacrylate, dodecyl methacrylate, methoxydiethylene glycol methacrylate, phenyl methacrylate, phenoxyethyl methacrylate, tetrahydrofurfuryl methacrylate, tert-butylcyclohexyl methacrylate, behenyl methacrylate, dicyclopentanyl methacrylate, dicyclopentenyloxyethyl methacrylate, 2-ethylhexylmethacrylate, octyl methacrylate, isooctylmethacrylate, hexadecyl methacrylate, octadecyl methacrylate, benzyl methacrylate, 2-phenylethylmethacrylate, 2-phenoxyethyl acrylate, cyclic trimethylolpropane formal acrylate, cyclohexyl methacrylate, and 4-tert-butylcyclohexylacrylate. However, the invention is not limited thereto. In other embodiments, a suitable first acrylate monomer may be selected based on the literature according to different needs.

In one embodiment, the second acrylate monomer may have a molecular weight ranging from 200 to 10,000. In some embodiments, the molecular weight of the second acrylate monomer is greater than the molecular weight of the first acrylate monomer. In alternative embodiments, the second acrylate monomer is different from the first acrylate monomer. The second acrylate monomer is, for example, neopentyl glycol propoxylate diacrylate, diethylene glycol dimethacrylate, 1,6-hexanedioldiacrylate, 1,6-hexanediol dimethacrylate, 1,12-dodecanediol dimethacrylate, or triallyl isocyanurate. However, the invention is not limited thereto. In other embodiments, a suitable second acrylate monomer may be selected based on the literature according to different needs.

In one embodiment, the surfactant has at least two thiol groups. In other embodiments, the surfactant may be a compound having multi-thiol groups.

In alternative embodiments, the surfactant is a compound represented by formula (I), formula (II) or formula (III) below:

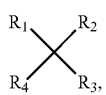

(I)

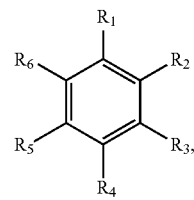

(II)

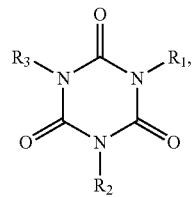

(III)

wherein $R_1$, $R_2$, $R_3$, $R_4$, $R_5$ and $R_6$ are the same as or different from one another, and are independently selected from the group consisting of hydrogen, $C_1$ to $C_{20}$ alkyl, $C_2$ to $C_{20}$ alkenyl, $C_2$ to $C_{20}$ alkynyl, $C_1$ to $C_{20}$ hydroxy alkyl, $C_1$ to $C_{20}$ alkyl ester, $C_2$ to $C_{20}$ alkyl ketone, $C_1$ to $C_{20}$ alkyl thioether and $C_1$ to $C_{20}$ alkoxy, wherein at least two of $R_1$ to $R_4$ have a thiol group when the surfactant is the compound of formula (I); at least two of $R_1$ to $R_6$ have a thiol group when the surfactant is the compound of formula (II); and at least two of $R_1$ to $R_3$ have a thiol group when the surfactant is the compound of formula (III).

In one embodiment, $C_1$ to $C_{20}$ alkyl may be linear or branched alkyl. Examples of the $C_1$ to $C_{20}$ alkyl include methyl, ethyl, propyl, n-butyl, isobutyl, pentyl, hexyl, heptyl, or the likes; however, the invention is not limited thereto.

In one embodiment, $C_2$ to $C_{20}$ alkenyl may be linear or branched alkenyl. Examples of the $C_2$ to $C_{20}$ alkenyl include ethenyl, propenyl, butenyl, pentenyl, hexenyl, heptenyl, or the likes; however, the invention is not limited thereto.

In one embodiment, $C_2$ to $C_{20}$ alkynyl may be linear or branched alkynyl. Examples of the $C_2$ to $C_{20}$ alkynyl include ethynyl, propynyl, butynyl, pentynyl, hexynyl, heptynyl, or the likes; however, the invention is not limited thereto.

In one embodiment, $C_1$ to $C_{20}$ hydroxy alkyl may be linear or branched hydroxy alkyl. Examples of the $C_1$ to $C_{20}$ hydroxy alkyl include hydroxy methyl, hydroxy ethyl, hydroxy propyl, hydroxy butyl, hydroxy pentyl, hydroxy hexyl, hydroxy heptyl, or the likes; however, the invention is not limited thereto.

In one embodiment, $C_1$ to $C_{20}$ alkyl ester may be linear or branched alkyl ester. Examples of the $C_1$ to $C_{20}$ alkyl ester include methyl methanoate, methyl ethanoate, ethyl propanoate, ethyl butanoate, methyl pentanoate, methyl hexanoate, methyl heptanoate, or the likes; however, the invention is not limited thereto.

In one embodiment, $C_2$ to $C_{20}$ alkyl ketone may be linear or branched alkyl ketone. Examples of the $C_2$ to $C_{20}$ alkyl ketone include ethyl propanone, ethyl butanone, methyl pentanone, methyl hexanone, methyl heptanone, methyl octanone or the likes; however, the invention is not limited thereto.

In one embodiment, $C_1$ to $C_{20}$ alkyl thioether may be linear or branched alkyl thioether. Examples of the $C_1$ to $C_{20}$ alkyl thioether include dimethylsulfanyl, diethylsulfanyl, ethylpropylsulfanyl, methyl butylsulfanyl, butylsulfanyl, methyl pentylsulfanyl, methyl hexylsulfanyl, methyl heptylsulfanyl or the likes; however, the invention is not limited thereto.

In one embodiment, $C_1$ to $C_{20}$ alkoxy may be linear or branched alkoxy. Examples of the $C_1$ to $C_{20}$ alkoxy include methoxy, ethoxy, propoxy, butoxy, pentyloxy, hexyloxy, heptyloxy, or the likes; however, the invention is not limited thereto.

In another embodiment, the surfactant is represented by the above formula (I), formula (II) or formula (III), wherein at least two of $R_1$ to $R_6$ are $C_1$ to $C_{20}$ alkyl having a thiol group. For example, $R_1$ and $R_2$ are both $C_1$ to $C_{20}$ alkyl having a thiol group; $R_1$, $R_2$ and $R_3$ are all $C_1$ to $C_{20}$ alkyl having a thiol group; $R_1$, $R_2$, $R_3$ and $R_4$ are all $C_1$ to $C_{20}$ alkyl having a thiol group; $R_1$, $R_3$, $R_4$ and $R_6$ are all $C_1$ to $C_{20}$ alkyl having a thiol group; or $R_1$, $R_4$, $R_5$ and $R_6$ are all $C_1$ to $C_{20}$ alkyl having a thiol group. However, the present invention is not limited thereto. In alternative embodiments, the above $C_1$ to $C_{20}$ alkyl may also be replaced by $C_2$ to $C_{20}$ alkenyl, $C_2$ to $C_{20}$ alkynyl, $C_1$ to $C_{20}$ hydroxy alkyl, $C_1$ to $C_{20}$ alkyl ester, $C_2$ to $C_{20}$ alkyl ketone, $C_1$ to $C_{20}$ alkyl thioether, or $C_1$ to $C_{20}$ alkoxy.

In specific embodiments, the surfactant may be a compound selected from the group consisting of 1,3-propanedithiol, 2,2'-thiodiethanethiol, 1,3-benzenedithiol, 1,3-benzenedimethanethiol, glycol dimercaptoacetate, trimethylolpropane trimercaptoacetate, tris[2-(3-mercaptopropionyloxy)ethyl]isocyanurate; however, the invention is not limited thereto.

In one embodiment, the surfactant has a molecular weight ranging from 100 to 1,000. In alternative embodiments, the surfactant has a molecular weight ranging from 100 to 500.

It should be noted that the surfactant has a plurality of thiol groups that facilitate to uniformly disperse the luminescent material 122 (hereinafter referred to as quantum dots 122) and prevent the quantum dots 122 from aggregation. Additionally, the surfactant may also increase the resistance of the quantum dots 122 to external environmental factors. In particular, since the surfactant has the plurality of thiol groups, not all of the thiol groups interact with the quantum dots 122, and the thiol groups not interacting with the quantum dots 122 may cross-link with other compounds thereby forming a relatively stable optical film. In other words, in the present embodiment, a portion of the thiol groups of the surfactant interact with the quantum dots 122, while another portion of the thiol groups of the surfactant cross-link with other compounds. Therefore, compared to a conventional optical film (which uses an amine compound), the optical film formed in the present embodiment has improved stability. That is, even if the optical film is irradiated with light or contacts external interfering factors, such as water, moisture, oxygen or the like, the external interfering factors do not affect the efficacy of the optical film. Thus, the need for a barrier material is effectively eliminated.

In one embodiment, the cross-linker may be, but is not limited to, a suitable acrylic-based compound having a molecular weight ranging from 100 to 2,000. Examples of the cross-linker include 4-hydroxybutyl acrylate, 4-hydroxybutyl acrylate glycidylether, diallyl phthalate, 1,4-cyclohexane dimethanol monoacrylate, trimethallyl isocyanurate, or [2[1,1-dimethyl-2-[(1-oxoallyl)oxy]ethyl]-5-ethyl-1,3-dioxan-5-yl]methyl acrylate.

In one embodiment, the initiator may be a photoinitiator or a thermal initiator. In the present embodiment, the example used in the optical composite material 10 may be a photoinitiator. That is, the optical composite material 10 of the present embodiment may be obtained within the minimum curing time simply by irradiation with light. In other embodiments, examples of the initiator include, but not limited to, benzoin ethers, benzyl ketals, a-dialkoxy-acetophenones, a-amino-alkylphenones, acylphosphine oxides, benzophenones, thioxanthones, titanocenes, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, methylbenzoylformate, oxy-phenyl-acetic acid, 2-[2 oxo-2 phenyl-acetoxy-ethoxy]-ethyl ester, oxy-phenyl-acetic 2-[2-hydroxy-5 ethoxy]-ethyl ester, alpha-dimethoxy-alpha-phenylacetophenone, 2-benzyl-2-(dimethylamino)-1-[4-(4-morpholinyl)phenyl]-1-butanone, 2-methyl-1-[4-(methylthio)phenyl]-2-(4-morpholinyl)-1-propanone, or diphenyl(2,4,6-trimethylbenzoyl)phosphine oxide.

In one embodiment, the quantum dot layer 120 further includes particles with a content of less than the sum content of the luminescent material 122 and the resin material 124. The particles are selected from the group consisting of titanium dioxide, zinc oxide, zinc sulfide, silica, zirconium oxide, antimony trioxide, alumina, Lonsdaleite, diamond-like carbon, bismuth oxychloride (BiOCl), barium titanate, potassium lithium niobate, lithium niobate, lithium tantalate, proustite, polyfluoroolefin, polycarbonate, polystyrene, and an arbitrary combination thereof. The particles may have a particle size ranging from 0.02 μm to 30 μm. The particles may be used to scatter incident light and to increase the chance of the incident light reacting with the luminescent material 122, thereby enhancing absorption and conversion efficiency of the luminescent material 122 for the incident light. The particles may also be used to scatter emitted light and to increase the chance of the emitted light interacting with a surface of the quantum dot layer 120, thereby enhancing the luminous efficiency of the quantum dot layer 120.

FIG. 4A to FIG. 4D are respectively schematic cross-sectional views of backlight modules according to various embodiments of the invention. In the following embodiments, for the sake of brevity, only the light source 104, a red phosphor layer 412, and composite color-conversion layers 410a, 410b, 410c, and 410d are illustrated, and the light guide plate and the reflective layer are omitted. The arrangement of the light guide plate and the reflective layer is shown in the description of FIG. 1.

Figure 4A:
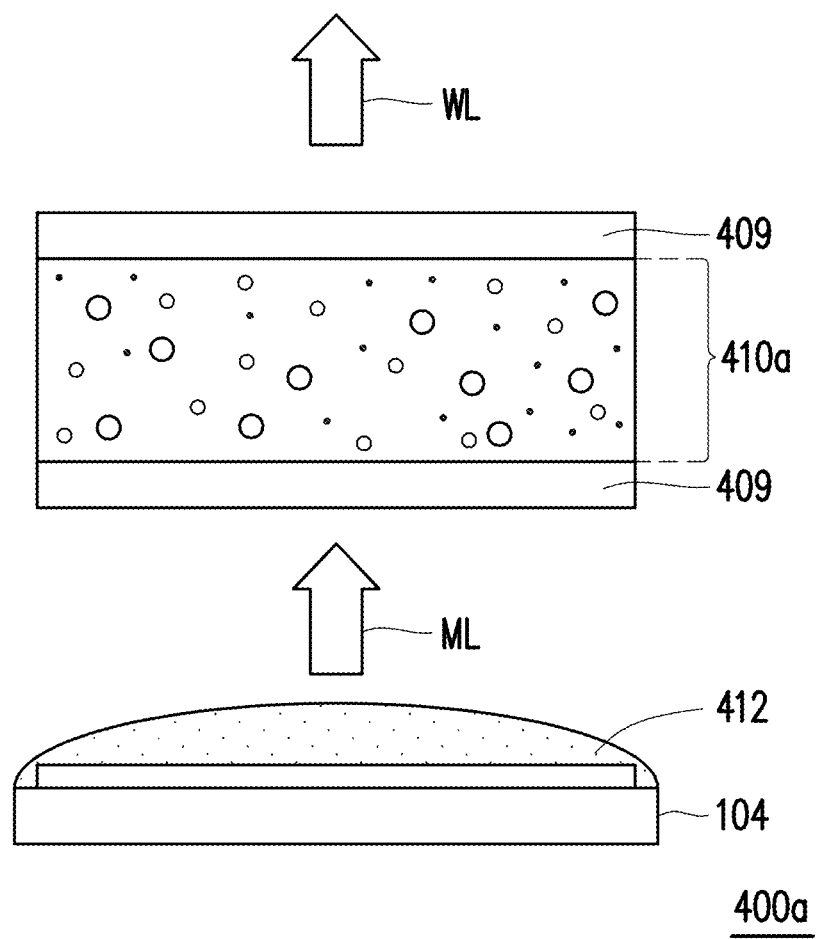
FIG. 4A to FIG. 4D are respectively schematic cross-sectional views of backlight modules according to various embodiments of the invention.

Referring to FIG. 4A, the present embodiment provides another backlight module 400a including the light source 104, the red phosphor layer 412, and the composite color-conversion layer 410a. In the present embodiment, the light source 104 may be an LED that emits blue light. The red phosphor layer 412 may be an encapsulant mixed with red-emitting phosphors. In some embodiments, the red-emitting phosphors may be a phosphor material having a main emission wavelength of 590 nm to 680 nm, such as, but not limited to, KSF ($K_2SiF_6:Mn^{4+}$), $CaAlSiN_3:Eu^{2-}$, $YVO_4:Eu^{3+}$, $LiEuW_2O_8$, $Y_2O_2S:Eu^{3+}$, or a combination thereof.

As shown in FIG. 4A, the blue light emitted by the light source 104 transmits through the red phosphor layer 412 to form a magenta light ML having the blue and red lights mixed to each other, hereinafter referred to as a mixed light ML. The mixed light ML is optically coupled to the light guide plate (not shown) and transmits through the light guide plate 102 to the composite color-conversion layer 410a. Then, the blue light in the mixed light ML is partially converted into a green light, a cyan light, and/or a yellow light by the composite color-conversion layer 410a. The mixed light ML, the green light, the cyan light, and/or the yellow light are mixed together to form a white light WL which then transmits to the display panel (not shown) over the composite color-conversion layer 410a.

As shown in FIG. 4A, the composite color-conversion layer 410a includes at least two different populations of quantum dots dispersed and embedded in a resin material. In an embodiment, the composite color-conversion layer 410a includes a plurality of green quantum dots and a plurality of yellow quantum dots mixed uniformly in the resin material. In another embodiment, the composite color-conversion layer 410a includes a plurality of green quantum dots and a plurality of cyan quantum dots mixed uniformly in the resin material. In an alternative embodiment, the composite color-conversion layer 410a may also include a plurality of green quantum dots, a plurality of cyan quantum dots, and a plurality of yellow quantum dots mixed uniformly in the resin material. As shown in FIG. 4A, the composite color-conversion layer 410a may be sandwiched between two substrates 409. Since the materials of the quantum dots, the resin material, and the substrates have been described in detail in the above paragraphs, and will not be described again.

Figure 4B:
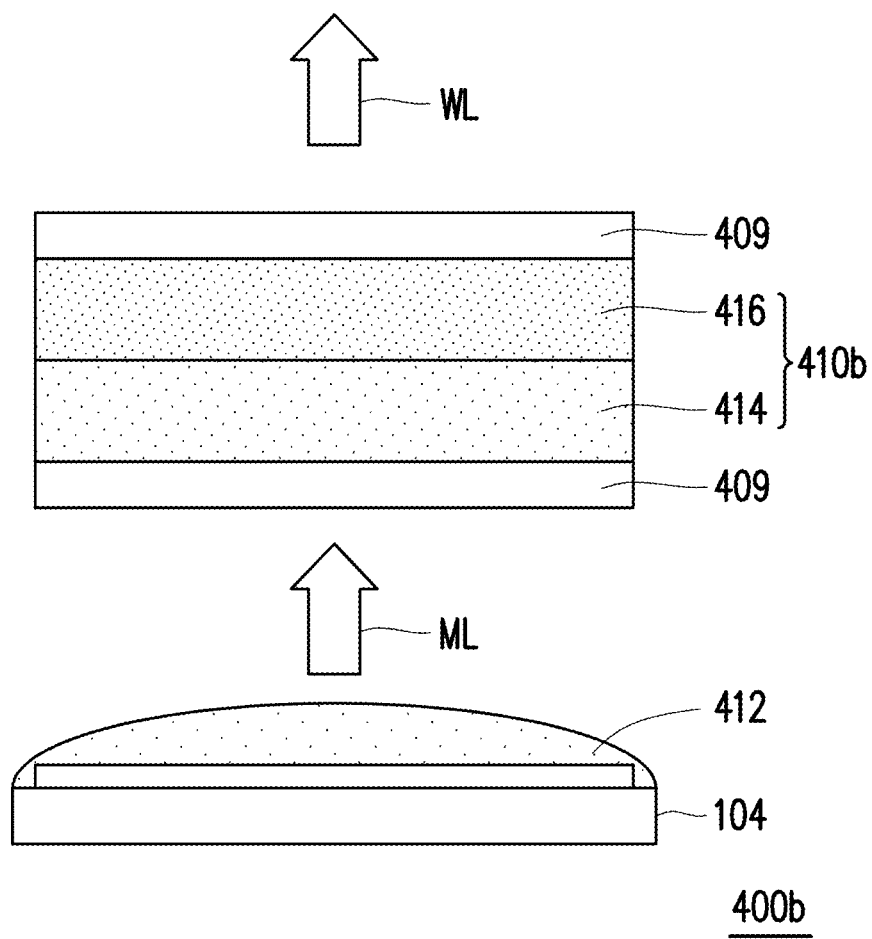

Although the composite color-conversion layer 410a illustrated in FIG. 4A includes a mixed quantum dot layer mixed with at least two different populations of quantum dots, the invention is not limited thereto. In another embodiment, as shown in FIG. 4B, a backlight module 400b includes a composite color-conversion layer 410b. The composite color-conversion layer 410b includes a first layer 414 and a second layer 416. The first layer 414 is adjacent to the light source 104 and includes a plurality of first quantum dots (e.g., yellow quantum dots), hereinafter referred to as a yellow quantum dot layer 414. The second layer 416 is further away from the light source 104 than the first layer 414 and includes a plurality of second quantum dots (e.g., green quantum dots), hereinafter referred to as a green quantum dot layer 416. As shown in FIG. 4B, the composite color-conversion layer 410b may also be sandwiched between two substrates 409.

Figure 4C:
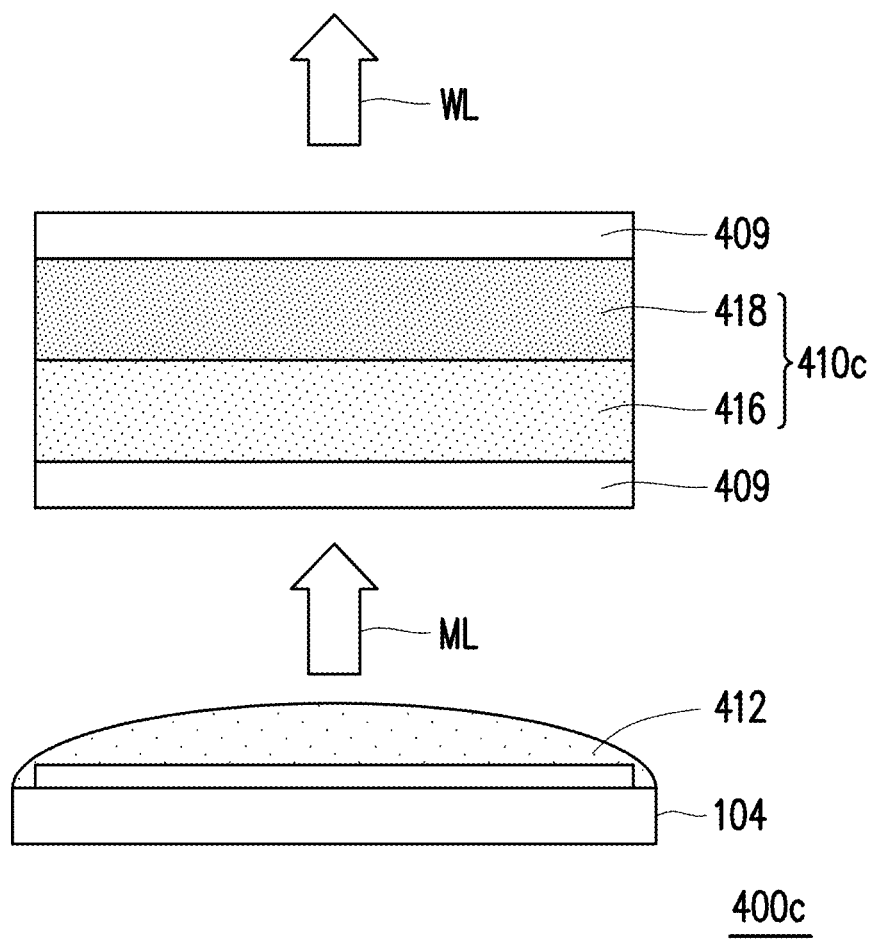

Referring to FIG. 4C, in alternative embodiments, a backlight module 400c includes a composite color-conversion layer 410c. The composite color-conversion layer 410c includes a green quantum dot layer 416 and a cyan quantum dot layer 418. The green quantum dot layer 416 is closer to the light source 104 than the cyan quantum dot layer 418.

Figure 4D:
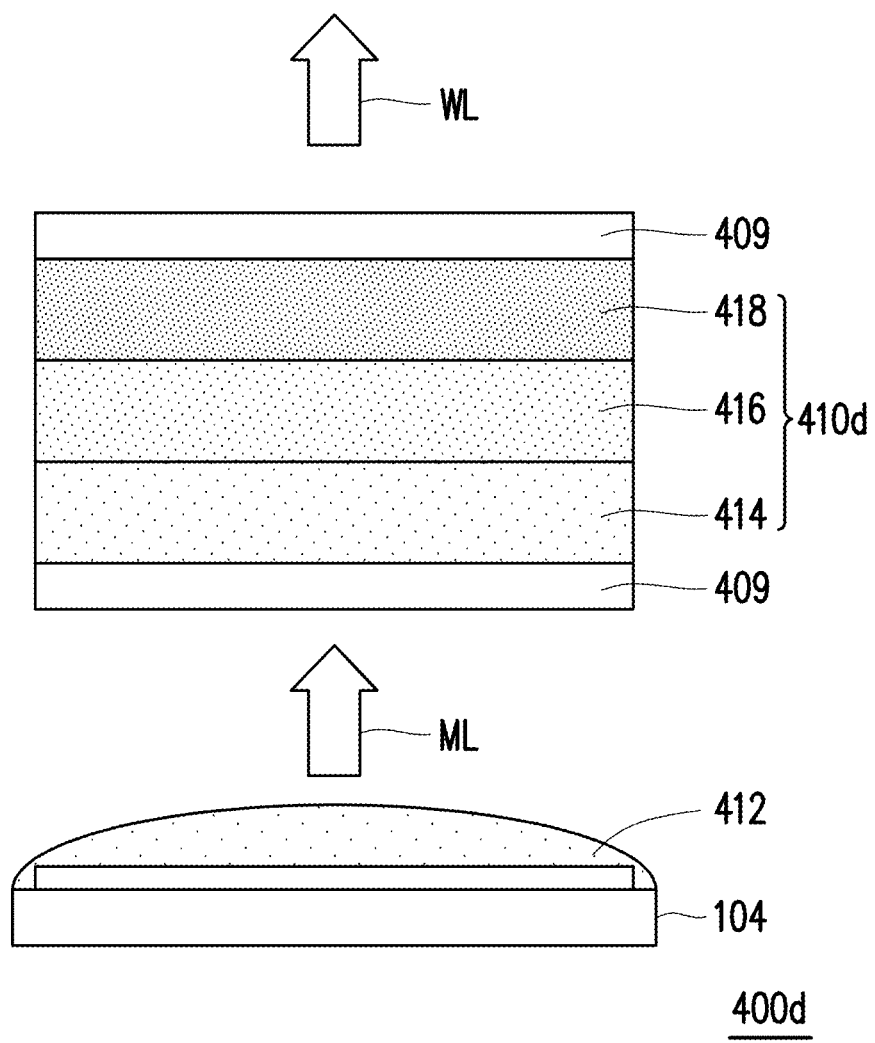

Referring to FIG. 4D, the configuration of a backlight module 400d is the same as that of the backlight module 400c and has been described in detail in the above paragraphs, and thus will not be described again. A difference between the above two lies in that a composite color-conversion layer 410d of the backlight module 400d further includes a yellow quantum dot layer 414, and the green quantum dot layer 416 is disposed between the yellow quantum dot layer 414 and the cyan quantum dot layer 418.

In the above embodiments, the red quantum dot layer in the composite color-conversion layer 110a of FIG. 2A is replaced by the red phosphor layer 412, and the red phosphor layer 412 is used to encapsulate the blue light source 104. Therefore, in addition to the ultra-wide color gamut and better eye protection, the backlight modules 400a, 400b, 400c, and 400d of the present embodiment have the advantages of simple structure, mature technology, and low cost. In addition, although the quantum dot layers illustrated in FIGS. 4B to 4D are in direct contact to each other, the present invention is not limited thereto. In other embodiments, substrates may be included between the adjacent two quantum dot layers, so that the adjacent two quantum dot layers are not direct in contact to each other.

Experiment examples of the invention are mentioned below to more specifically describe the invention. However, the materials, methods used and so on as shown in the following experiment examples may be suitably modified without departing from the spirit of the invention. Therefore, the scope of the invention should not be interpreted in a limiting sense using the experiment examples shown below.

Comparative Example 1

Figure 5:
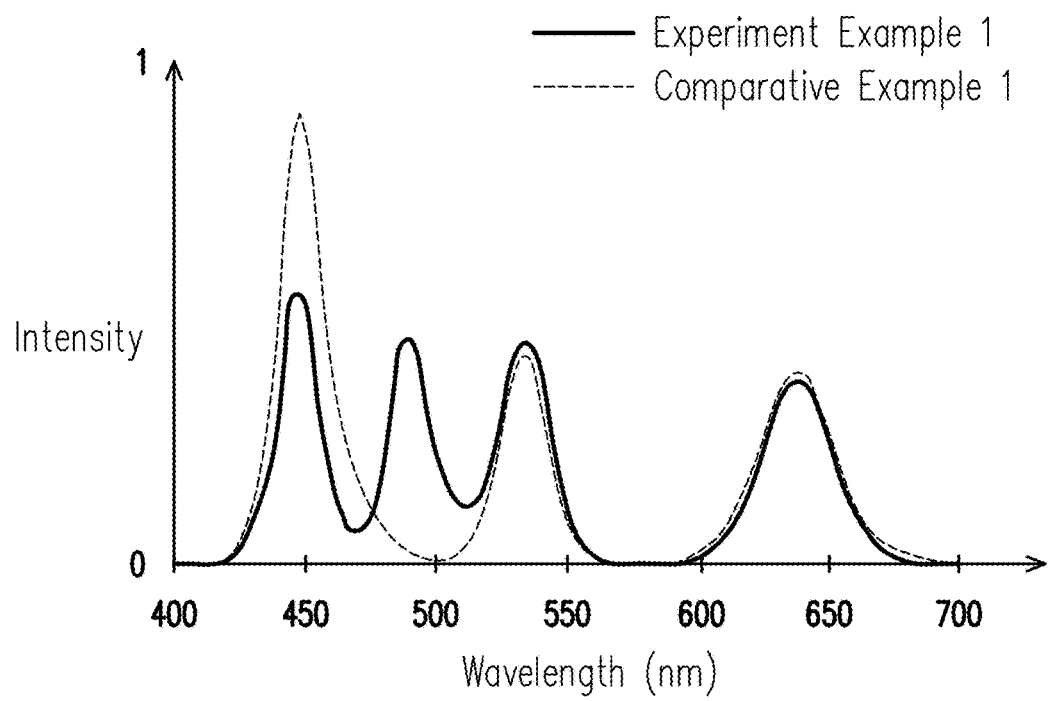
FIG. 5 is a graph showing the relationship between the luminous intensity and the wavelength of the composite color-conversion layer of Experimental Example 1 and Comparative Example 1.
Figure 6:
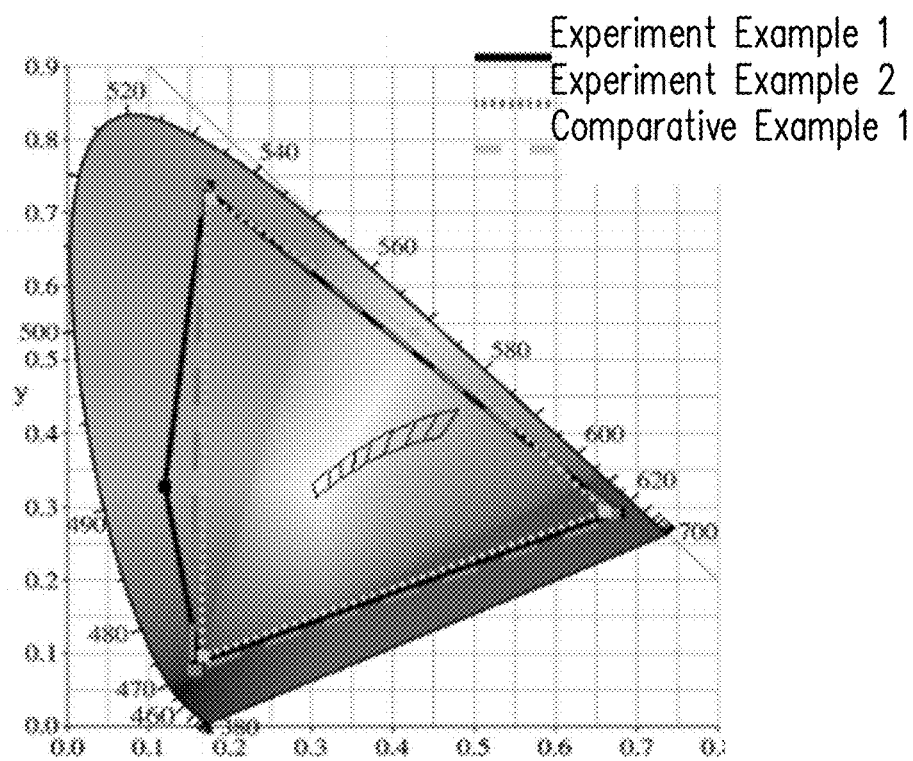
FIG. 6 is a chromaticity diagram showing the composite color-conversion layer of Experimental Examples 1, 2, and Comparative Example 1.

0.09 wt % of red quantum dots (CdSe/ZnS quantum dots), 0.91 wt % of green quantum dots (CdSe/ZnS quantum dots) were mixed with acrylic resin precursors and cured by ultraviolet (UV) light to form a quantum dot layer. The quantum dot layer is placed in the backlight module 100 of FIG. 1, and a luminometer is used to measure the quantum dot layer. The results are shown in FIG. 5 and FIG. 6.

Experiment Example 1

First, 0.09 wt % of red quantum dots (CdSe/ZnS quantum dots), 0.9 wt % of green quantum dots (CdSe/ZnS quantum dots), 2.7 wt % of cyan quantum dots (CdSe/ZnS quantum dots) were mixed with acrylic resin precursors and cured by ultraviolet (UV) light to form a quantum dot layer. The quantum dot layer is then placed in the backlight module 100 of FIG. 1. Thereafter, a luminometer is used to measure the quantum dot layer. The results are shown in FIG. 5 and FIG. 6.

Experiment Example 2

First, 0.09 wt % of red quantum dots (CdSe/ZnS quantum dots), 1.8 wt % of green quantum dots (CdSe/ZnS quantum dots), 0.3 wt % of yellow quantum dots (CdSe/ZnS quantum dots) were mixed with acrylic resin precursors and cured by ultraviolet (UV) light to form a quantum dot layer. The quantum dot layer is then placed in the backlight module 100 of FIG. 1. Thereafter, a luminometer is used to measure the quantum dot layer. The result is shown in FIG. 6.

Referring to FIG. 5, since the cyan light (having an emission wavelength of about 490 nm) emitted by the cyan quantum dots of Experimental Example 1 replaces a portion of the blue light (having an emission wavelength of about 450 nm) from the light source 104, the blue light from the light source 104 in Experimental Example 1 is lower than the blue light from the light source 104 in Comparative Example 1. This effectively reduces the blue light harmful to eyes, so as to provide better eye protection. In addition, as shown in FIG. 6, the color gamut of Experimental Example 1 did not decrease. That is to say, a display with the cyan quantum dots not only can effectively reduces blue light, but also maintain the color gamut and the ability of the display to faithfully reproduce colors. Further, as shown in FIG. 6, compared with Comparative Example 1, the display having the yellow quantum dots of Experimental Example 2 can widen the color gamut and increase the ability of the display to reproduce more realistic colors.

Comparative Example 2

Figure 7:
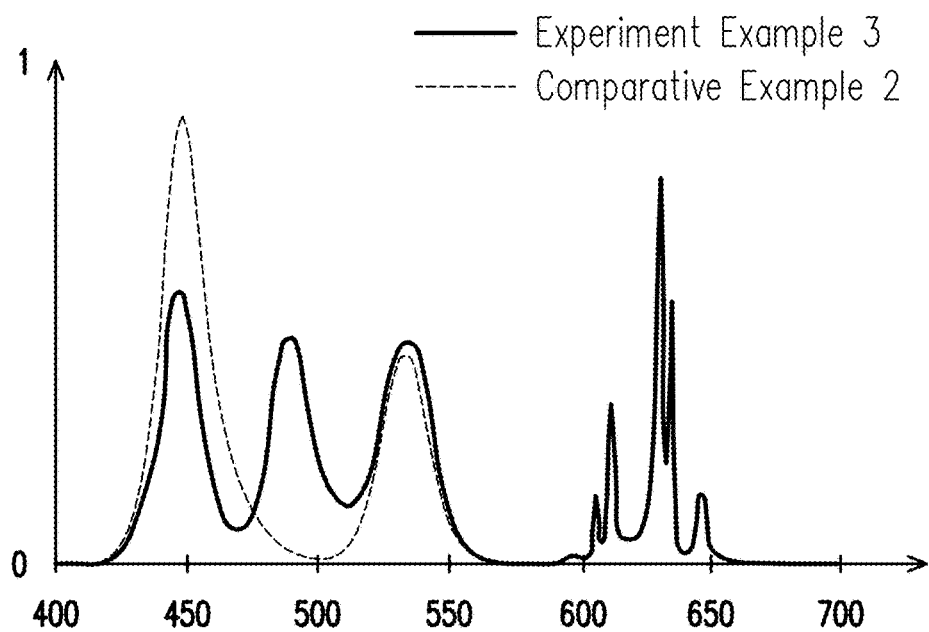
FIG. 7 is a graph showing the relationship between the luminous intensity and the wavelength of the composite color-conversion layer of Experimental Example 3 and Comparative Example 2.
Figure 8:
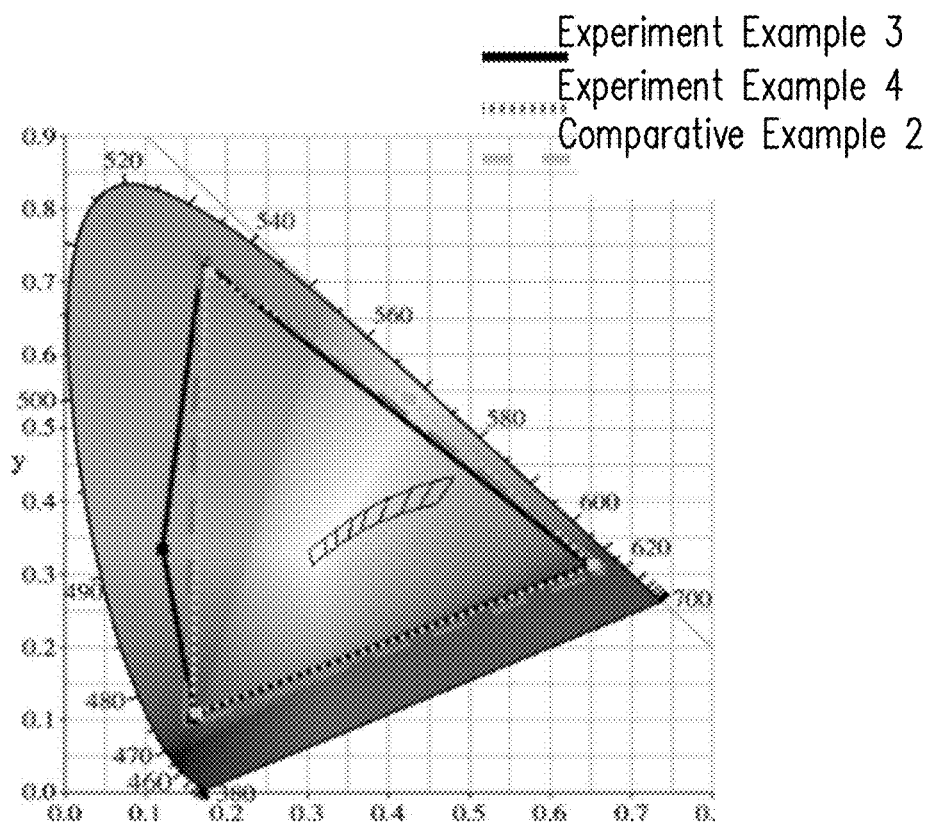
FIG. 8 is a chromaticity diagram showing the composite color-conversion layer of Experimental Examples 3, 4, and Comparative Example 2.

0.9 wt % of green quantum dots (CdSe/ZnS quantum dots) were mixed with acrylic resin precursors and cured by ultraviolet (UV) light to from a green quantum dot layer. Next, KSF was mixed with an encapsulant (OE-6370 HF, purchased from Dow Corning®) to encapsulate the blue LED. Thereafter, the green quantum dot layer was disposed on the packaged blue LED (the structure is as shown in the backlight module 400*a* of FIG. 4A), and is measured using a luminometer. The results are shown in FIG. 7 and FIG. 8.

Experiment Example 3

2.7 wt % of cyan quantum dots (CdSe/ZnS quantum dots), 0.9 wt % of green quantum dots (CdSe/ZnS quantum dots) were mixed with acrylic resin precursors and cured by ultraviolet (UV) light to form a quantum dot layer. Next, KSF was mixed with an encapsulant (OE-6370 HF, purchased from Dow Corning®) to encapsulate the blue LED. Thereafter, the quantum dot layer was disposed on the packaged blue LED (the structure is as shown in the backlight module 400*a* of FIG. 4A), and is measured using a luminometer. The results are shown in FIG. 7 and FIG. 8.

Experiment Example 4

0.3 wt % of yellow quantum dots (CdSe/ZnS quantum dots), 1.8 wt % of green quantum dots (CdSe/ZnS quantum dots) were mixed with acrylic resin precursors and cured by ultraviolet (UV) light to form a quantum dot layer. Next, KSF was mixed with an encapsulant (OE-6370 HF, purchased from Dow Corning®) to encapsulate the blue LED. Thereafter, the quantum dot layer was disposed on the packaged blue LED (the structure is as shown in the backlight module 400*a* of FIG. 4A), and is measured using a luminometer. The result is shown in FIG. 8.

Referring to FIG. 7, since the cyan light (having an emission wavelength of about 490 nm) emitted by the cyan quantum dots of Experimental Example 3 replaces a portion of the blue light (having an emission wavelength of about 450 nm) from the light source 104, the blue light from the light source 104 in Experimental Example 3 is lower than the blue light from the light source 104 in Comparative Example 2. This effectively reduces the blue light harmful to eyes, so as to provide better eye protection. In addition, as shown in FIG. 7, the color gamut of Experimental Example 3 did not decrease. That is to say, a display with the cyan quantum dots not only can effectively reduce blue light, but also maintain the color gamut and the ability of the display to faithfully reproduce colors. Further, as shown in FIG. 8, compared with Comparative Example 2, the display having the yellow quantum dots of Experimental Example 4 can widen the color gamut and increase the ability of the display to reproduce more realistic colors.

In summary, the embodiment of the present invention provides a backlight module having a plurality of different populations of quantum dots with different emission wavelengths to realize an ultra-wide color gamut using multi-primary color, thereby increase the ability to faithfully reproduce colors. In addition, in the embodiment of the present invention, the blue light harmful to eyes is partially replaced by the cyan light emitted by the cyan quantum dots to provide better eye protection. Further, in the embodiment of the present invention, a plurality of quantum dots having different emission wavelengths are respectively disposed at different levels, so as to prevent the quantum dots with the longer emission wavelength from reducing the light conversion efficiency by absorbing shorter wavelength light emitted by the other quantum dots and performing a second conversion. In other words, the backlight module of the embodiment of the present invention can increase the light conversion efficiency, thereby improving the energy efficiency and display brightness of the display device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A backlight module, comprising:
   a light source emitting a blue light;
   a light guide plate optically coupled to the light source, and the blue light transmitting through the light guide plate; and
   a composite color-conversion layer disposed over the light guide plate, wherein the composite color-conversion layer comprises:
   a first layer, adjacent to the light source and comprising a plurality of first quantum dots, wherein the plurality of first quantum dots are a plurality of red quantum dots;
   a second layer, further away from the light source than the first layer and comprising a plurality of second quantum dots, wherein the plurality of second quantum dots are a plurality of cyan quantum dots;
   a third layer, disposed between the first layer and the second layer and comprising a plurality of third quantum dots, wherein the plurality of third quantum dots are a plurality of green quantum dots; and
   a fourth layer, disposed between the first layer and the third layer and comprising a plurality of fourth quantum dots, wherein the plurality of fourth quantum dots are a plurality of yellow quantum dots, wherein an emission wavelength of the plurality of first quantum dots is longer than an emission wavelength of the plurality of fourth quantum dots, the emission wavelength of the plurality of fourth quantum dots is longer than an emission wavelength of the plurality of third quantum dots, and the emission wavelength of the plurality of third quantum dots is longer than an emission wavelength of the plurality of second quantum dots.

2. The backlight module of claim 1, wherein the fourth layer is in direct contact with the first layer and the third layer, the third layer is in direct contact with the fourth layer and the second layer, and the first layer, the second layer, the third layer, and the fourth layer are sandwiched between two substrates.

3. The backlight module of claim 1, further comprising at least one substrate disposed between the first layer and the fourth layer, between the third layer and the fourth layer, or between the second layer and the third layer.

4. The backlight module of claim 3, wherein the at least one substrate is free of a barrier layer.

5. The backlight module of claim 1, further comprising:
   two first substrates, the first layer sandwiched between the two first substrates;
   two second substrates, the second layer sandwiched between the two second substrates;
   two third substrates, the third layer sandwiched between the two third substrates; and
   two fourth substrates, the fourth layer sandwiched between the two fourth substrates, wherein one of the two first substrates is in direct contact with adjacent fourth substrate, one of the two second substrates is in direct contact with adjacent third substrate, and the other one of the two third substrates is in direct contact with adjacent other fourth substrate.

6. The backlight module of claim 1, wherein each of the first, second, third, and fourth layers comprises a resin material, the plurality of first, second, third, and fourth quantum dots are respectively dispersed and embedded in the resin material, wherein the resin material is prepared by a precursor, the precursor comprises a surfactant having a thiol group.

7. The backlight module of claim 6, wherein the surfactant is a compound represented by formula (I), formula (II) or formula (III) below:

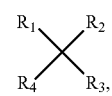
(I)

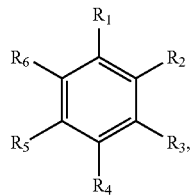
(II)

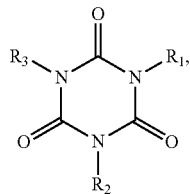
(III)

wherein $R_1$, $R_2$, $R_3$, $R_4$, $R_5$ and $R_6$ are the same as or different from one another, and are independently selected from the group consisting of hydrogen, $C_1$ to $C_{20}$ alkyl, $C_2$ to $C_{20}$ alkenyl, $C_2$ to $C_{20}$ alkynyl, $C_1$ to $C_{20}$ hydroxy alkyl, $C_1$ to $C_{20}$ alkyl ester, $C_2$ to $C_{20}$ alkyl ketone, $C_1$ to $C_{20}$ alkyl thioether and $C_1$ to $C_{20}$ alkoxy, wherein at least two of $R_1$ to $R_4$ have a thiol group when the surfactant is the compound of formula (I); at least two of $R_1$ to $R_6$ have a thiol group when the surfactant is the compound of formula (II); and at least two of $R_1$ to $R_3$ have a thiol group when the surfactant is the compound of formula (III).

8. The backlight module of claim 6, wherein the precursor of the resin material comprises:
  5 wt % to 30 wt % of the surfactant having at least two thiol groups;
  30 wt % to 50 wt % of a first acrylate monomer;
  15 wt % to 30 wt % of a second acrylate monomer;
  5 wt % to 20 wt % of a cross-linker; and
  1 wt % to 2 wt % of an initiator.

* * * * *